(12) United States Patent
Furusawa et al.

(10) Patent No.: US 6,586,982 B2
(45) Date of Patent: Jul. 1, 2003

(54) SEMICONDUCTOR CIRCUIT HAVING A COMBINATION CIRCUIT BEING SWITCHED BETWEEN AN ACTIVE AND INACTIVE STATE

(75) Inventors: Toshiyuki Furusawa, Tokyo (JP); Daisuke Sonoda, Yokohama (JP); Kimiyoshi Usami, Yokohama (JP); Naoyuki Kawabe, Kawasaki (JP); Masayuki Koizumi, Yokohama (JP); Hidemasa Zama, Kawasaki (JP); Masahiro Kanazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/961,027

(22) Filed: Sep. 21, 2001

(65) Prior Publication Data

US 2002/0036529 A1 Mar. 28, 2002

(30) Foreign Application Priority Data

Sep. 27, 2000 (JP) ........................ 2000-295234

(51) Int. Cl.[7] .............................. H03K 3/037
(52) U.S. Cl. ........................ 327/225; 327/544
(58) Field of Search .................. 327/199, 200, 327/208, 210, 225, 544

(56) References Cited

U.S. PATENT DOCUMENTS 6,140,864 A * 10/2000 Hirata et al. ................. 327/544
6,384,674 B2 * 5/2002 Tanizaki et al. ............. 327/544

FOREIGN PATENT DOCUMENTS

JP 9-261013 10/1997

* cited by examiner

Primary Examiner—Kenneth B. Wells
(74) Attorney, Agent, or Firm—Frommer Lawerence & Haug LLP; Grace L. Pan

(57) ABSTRACT

A combination circuit is switched between an active state where power is supplied thereto in response to a control signal and an inactive state where power thereto is interrupted. A flip-flop circuit connected to an input terminal of the combination circuit stores an output signal of the combination circuit in response to a clock signal. The combination circuit is set to an operative state by the control signal immediately before the flip-flop circuit operates in response to the clock signal.

9 Claims, 5 Drawing Sheets

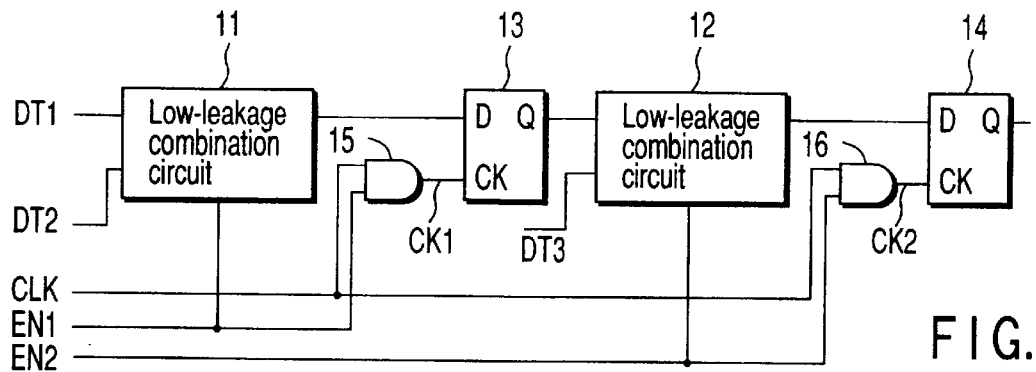
FIG. 1
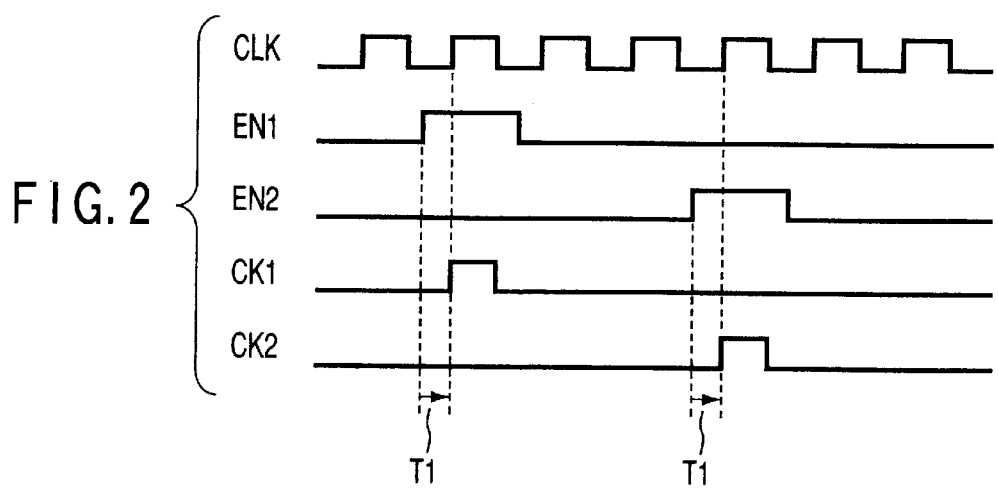
FIG. 2
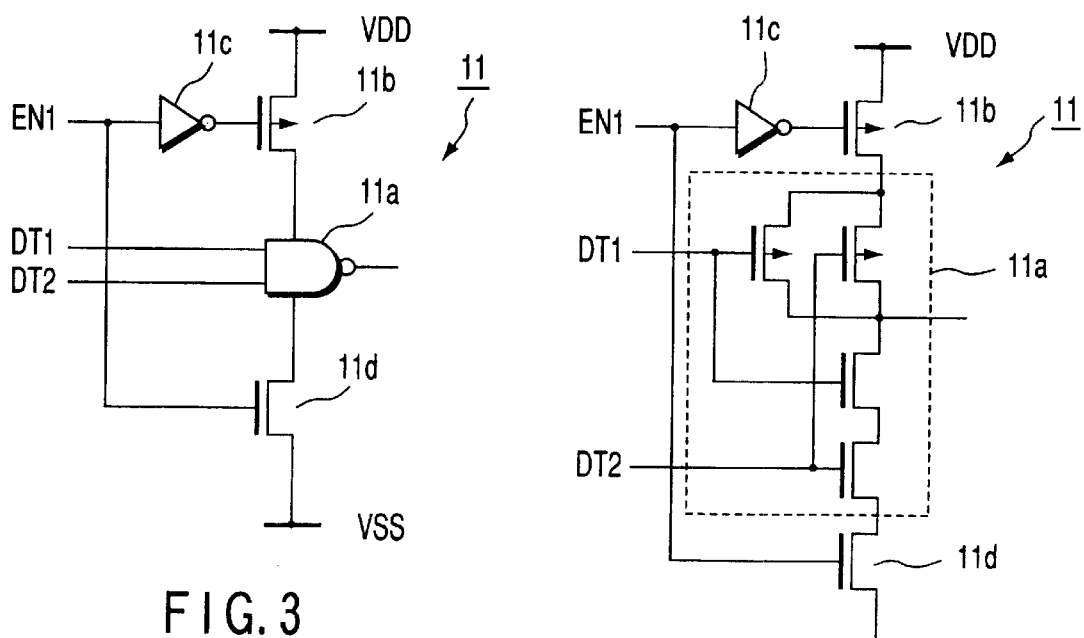
FIG. 3
FIG. 4

SEMICONDUCTOR CIRCUIT HAVING A COMBINATION CIRCUIT BEING SWITCHED BETWEEN AN ACTIVE AND INACTIVE STATE

CROSS-REFERENCE TO RELATED APPLICATIONS

This application is based upon and claims the benefit of priority from the prior Japanese Patent Application No. 2000-295234, filed Sep. 27, 2000, the entire contents of which are incorporated herein by reference.

BACKGROUND OF THE INVENTION

1. Field of the Invention

The present invention relates to a semiconductor integrated circuit (IC) for use in electronic equipment driven by a battery of, for example, a mobile terminal unit.

2. Description of the Related Art

With an improvement in micro-lithographic processes and a decrease in supply voltage of an IC, the threshold voltage of transistors thereof has been lowered. A reduced threshold voltage enhances the operating speed of the transistors. A decrease in threshold voltage, on the other hand, brings about an increase in leakage current of the transistors in a standby state, a major problem.

Electronic equipment driven by a battery of a mobile terminal unit, in particular, needs to prolong the standby time as much as possible. Accordingly, it is important for an LSI installed in this kind of electronic equipment to have a reduced standby current. To reduce the standby current, there has been employed such a method that uses, for example, an MT (Multi-Threshold)-CMOS or turns OFF the power supply in the standby state, thus suppressing a current flowing through the LSI when it is not operating.

FIG. 13 shows one example of the above-mentioned MT-CMOS circuit. This MT-CMOS circuit is constituted of a low-threshold voltage circuit block 1, a P-channel MOS transistor Q1 having an ordinary threshold voltage, and an N-channel MOS transistor Q2. The low-threshold voltage circuit block 1 is connected between a virtual power supply line VDD1 and a virtual ground line VSS1. This low-threshold voltage circuit block 1 includes a plurality of transistors having a threshold voltage lower than those of the transistors Q1 and Q2. That is, this low-threshold voltage circuit block 1 includes a cell constituted of a plurality of logic circuits not shown. The transistor Q1 is connected between the virtual power supply line VDD1 and a power supply line VDD and the transistor Q2, between the virtual ground line VSS1 and the ground line VSS. Those transistors Q1 and Q2 are controlled by a control signal E.

In an active state (operating state), when the control signal E is activated, the transistors Q1 and Q2 are turned ON. This causes a supply voltage to be fed to the low-threshold voltage circuit block 1 through the transistors Q1 and Q2. The low-threshold voltage circuit block 1 operates at a high speed because it is made up of the low-threshold voltage transistors.

Furthermore, in a standby state, when the control signal E is deactivated, the transistors Q1 and Q2 are turned OFF. This causes a path interconnecting the power supply line and the ground line VSS to be interrupted, thus inhibiting a leakage current from occurring.

In the MT-CMOS circuit shown in FIG. 13, the transistors Q1 and Q2 act to control supply of power fed to all over the low-threshold voltage circuit block 1. A contrastive configuration may be possible in which only the cell of part of the logic circuit is made up of low-threshold voltage transistors.

In FIG. 14, a gate circuit 2 includes a logic circuit, indicated by a hatched line, which constitutes a critical path, for example. Before and behind the gate circuit 2 is connected a plurality of flip-flop circuits. Of these flip-flop circuits such flip-flop circuits (which are indicated by a hatched line) that are connected to the logic circuit of the above-mentioned critical path are made up of low-threshold voltage transistors in configuration. Such a configuration enables reducing the number of transistors with a low threshold voltage. This in turn enables reducing a leakage current in the standby state, thus leading to a high-speed operation.

The leakage current, however, flows not only when the semiconductor chip or the gate circuit is stopped but also when it is operating. With a recent trend for a lower power dissipation of the semiconductor IC, the leakage current in the operating state has been occupying a non-negligible proportion with respect to the original operating current dissipation.

In the circuit shown in FIGS. 13 and 14, however, in the active state, a leakage current flows through the low-threshold voltage transistors. To reduce the leakage current in the active state there is only one method available of enhancing the threshold voltage of the transistors. This method of enhancing the threshold voltage, however, is not desirable because the circuit is degraded in operating speed. Accordingly, this is desired such a semiconductor circuit that can reduce the leakage current even in the active state.

BRIEF SUMMARY OF THE INVENTION

According to an aspect of the present invention, there is provided a semiconductor IC comprising: a combination circuit to which an I/O signal and a control signal are supplied and which is switched between an active state where power is supplied according to the control signal and an inactive state where the power is interrupted; and flip-flop circuits which have input terminals connected to the output terminals of the combination circuit and which store an output signal of the combination circuit according to the clock signal, wherein the combination circuit is set to an operating state by the control signal immediately before the flip-flop circuits start to operate.

BRIEF DESCRIPTION OF THE SEVERAL VIEWS OF THE DRAWING

FIG. 1 is a block diagram showing a first embodiment of the present invention;

FIG. 2 is a timing chart showing operations of the first embodiment of FIG. 1;

FIG. 3 is a circuit diagram showing one example of a low-leakage combination circuit of FIG. 1;

FIG. 4 is a circuit diagram specifically showing the circuit of FIG. 3;

DETAILED DESCRIPTION OF THE INVENTION

Figure 5:
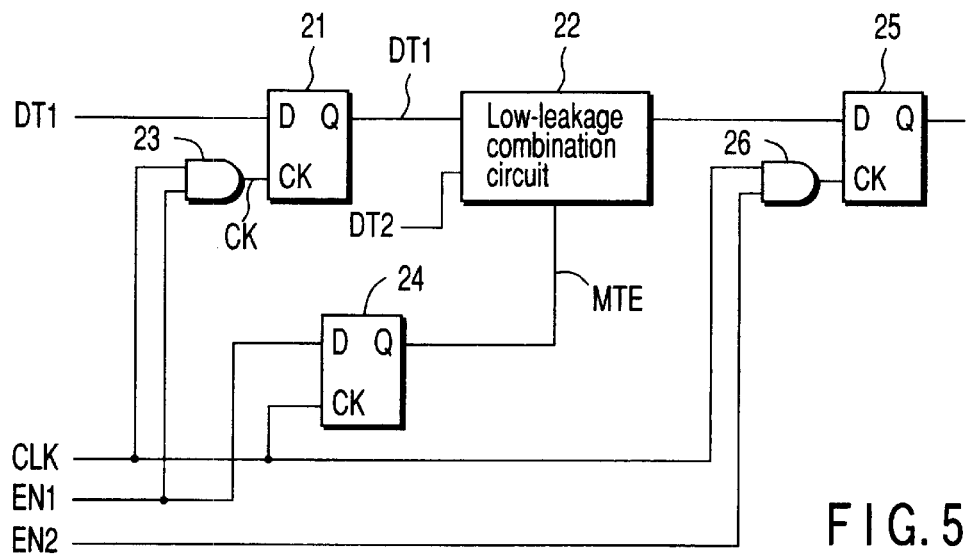
FIG. 5 is a block diagram showing a second embodiment of the present invention.

The following will describe embodiments of the present invention with reference to the drawings.

First Embodiment

FIG. 1 shows a first embodiment of the present invention, specifically part of a gate circuit in a semiconductor IC thereof. In FIG. 1, low-leakage combination circuits 11 and 12 are logic circuits each made up of a plurality of transistors. The threshold voltage of those transistors is set at lower than that of ordinary ones. Accordingly, those logic circuits are supposed to be able to operate at a high speed. The supply of power to those logic circuits is controlled by control signals EN1 and EN2. The low-leakage combination circuit 11 is supplied at its input terminal with data DT1 and DT2. The flip-flop circuit 13 has its input terminal D connected to the output terminal of the low-leakage combination circuit 11. The flip-flop circuit 13 has its output terminal Q connected to one input terminal of the low-leakage combination circuit 12. At the other input terminal of the low-leakage combination circuit 12 is supplied data DT3. A flip-flop circuit 14 has its one input terminal D connected to an output terminal of the output terminal of the low-leakage combination circuit 12.

An AND circuit 15 is supplied at its two input terminals with a clock signal CLK and the control signal EN1 respectively. An output signal of this AND circuit 15 is fed to a clock-signal input terminal CK of the flip-flop circuit 13. Further, an AND circuit 16 is supplied at its two input terminals with the clock signal CLK and the control signal EN2. An output signal of the AND circuit 16 is fed to the clock-signal input terminal CK of the flip-flop circuit 14.

The control signals EN1 and EN2 are generated by a control circuit not shown or a different combination circuit not shown either.

FIG. 3 is a circuit diagram for showing one example of the low-leakage combination circuit 11 and FIG. 4, a specific circuit diagram of FIG. 3. In FIGS. 3 and 4, the low-leakage combination circuit 11 is made up of, for example, a NAND circuit 11a. This NAND circuit 11a is constituted of, for example, such transistors that has a threshold voltage lower than that of an ordinary MOS transistor.

Between the NAND circuit 11a and the power supply line VDD is connected a P-channel MOS transistor 11b. This transistor 11b has a threshold voltage of, for example, an ordinary transistor, which is higher than that of the transistors of the NAND circuit 11a. This transistor 11b is supplied at its gate with the control signal EN1 through an inverter circuit 11c. Moreover, between the NAND circuit 11a and the ground lien VSS is connected an N-channel MOS transistor 11d, which has, for example, an ordinary threshold voltage. This transistor 11d is supplied at its gate with the control signal EN1. Accordingly, when the control signal EN1 is at a low level, the transistors 11b and 11d are both OFF, so that no power is fed to the NAND circuit 11a. When the control signal EN1 is at a high level, on the other hand, the transistors 11b and 11d are both ON, so that power is supplied to the NAND circuit 11a.

Supposing an absolute value of the threshold voltage of the P-channel MOS transistor 11b to be |Vthp|, the threshold voltage of the N-channel MOS transistor 11d to be Vthn, and an absolute value of the threshold voltage of the M-channel MOS transistor and the threshold voltage of the N-channel MOS transistor which constitute the NAND circuit 11a to be |Vthp1| and Vthn1 respectively, their relationship is represented by:

|Vthp|>|Vthp1| and

Vthn>Vthn1

The low-leakage combination circuit need not be made up of the NAND circuit 11a but of any other logic circuit. Moreover, the low-leakage combination circuit 12 may be of the same configuration as that of the low-leakage combination circuit 11 or any other logic circuit.

The operations of FIG. 1 of this configuration are described as follows with respect to FIG. 2.

As shown in FIG. 2, when the control signals EN1 and EN2 are both at a low level, no power is fed to the low-leakage combination circuits 11 and 12. This causes these circuits 11 and 12 to be turned OFF, thus generating no leakage current.

In this state, suppose that the control signal EN1 becomes high to take in data to, for example, the flip-flop circuit 13. Then, this control signal EN1 at a high level activates the low-leakage combination circuit 11. This causes data DT1 and DT2 to be fed to the low-leakage combination circuit 11. The control signal EN1 has, for example, the same pulse width as much as one cycle of the clock signal CLK and rises somewhat earlier than the clock signal CLK. Accordingly, the output signal CK1 of the AND circuit 15 to which the clock signal CLK and the control signal EN1 are fed becomes high at the leading edge of the clock signal CLK after the control signal EN1 rose.

The flip-flop circuit 13 takes in the output signal of the low-leakage combination circuit 11 according to the output signal CK1 of the AND circuit 15. The output signal of the low-leakage combination circuit 11 is established during a period T1 from a point in time when the control signal EN1 rose to a time point when the clock signal CLK rises. Therefore, the flip-flop circuit 13 can surely hold the output signal of the low-leakage combination circuit 11.

The low-leakage combination circuit 12 also operates in much the same way as the low-leakage combination circuit 11 according to the control signal EN2 and the clock signal CLK.

In the configuration of the first embodiment, the low-leakage combination circuits 11 and 12 are activated immediately before the flip-flop circuits 13 and 14 take in data respectively so that these flip-flop circuits 13 and 14 may take in data after the output data of the low-leakage combination circuit 11 and 12 is established respectively. Therefore, it is not problematic if the output data of the low-leakage circuits 11 and 12 is unstable in a leakage-reduced state, in which the operations are suspended.

According to the first embodiment described above, the low-leakage combination circuits 11 and 12 are each constituted of a logic circuit made up of low-threshold voltage transistors and the transistors 11b and 11d which are turned ON/OFF by the control signal, in which the low-leakage combination circuits 11 and 12 are activated when the flip-flop circuits 13 and 14 connected to the output terminal of these low-leakage combination circuits 11 and 12 respectively take in data. Therefore, power is fed only when the low-leakage combination circuits 11 and 12 output data, but not in any other state. This enables the low-leakage combination circuits 11 and 12 including a low-threshold voltage transistor to reduce the leakage current even when the other circuits are in an active state.

Furthermore, the low-leakage combination circuits 11 and 12 are each made up of low-threshold voltage transistors and so can operate at a high speed.

Second Embodiment

FIG. 5 shows a second embodiment. In the first embodiment, the low-leakage combination circuit is activated when the flip-flop circuit connected to the output of the low-leakage combination circuit takes in data. In contrast to it, the second embodiment features that the low-leakage combination circuit is activated when the flip-flop circuit connected to the input terminal of the low-leakage combination circuit takes in data.

In FIG. 5, the data DT1 is fed to an input terminal D of a flip-flop circuit 21. Data DT1 output from an output terminal Q of this flip-flop circuit 21 and different data DT2 are fed to a low-leakage combination circuit 22. The clock signal CLK and the control signal EN1 are fed to the input terminals of an AND circuit 23. The output signal CK of this AND circuit 23 is fed to a clock signal input terminal CK of the flip-flop circuit 21.

Furthermore, the control signal EN1 is fed to the input terminal D of a flip-flop circuit 24. The clock signal CLK is fed to the clock signal input terminal CK of the flip-flop circuit 24. A control signal MTE output from an output terminal of this flip-flop circuit 24 is fed to the low-leakage combination circuit 22.

An output signal of this low-leakage combination circuit 22 is fed to the input terminal D of the flip-flop circuit 25. The clock signal CLK and the control signal EN2 are fed to the input terminals of an AND circuit 26. The output signal of this AND circuit 26 is fed to the clock signal input terminal CK of the flip-flop circuit 25.

As described later, the low-leakage combination circuit 22 has a function to hold the output data of an immediately previous operation in a leakage-reduced state in which it is not supplied with power.

Figure 6:
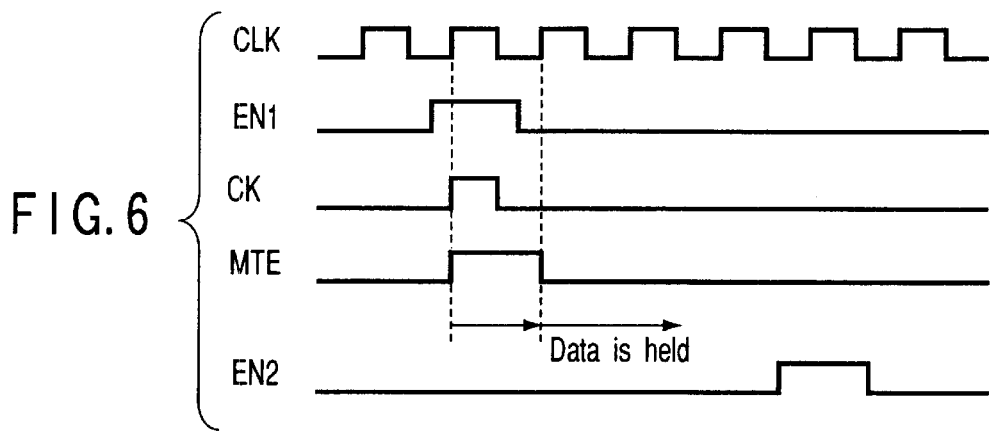
FIG. 6 is a timing chart showing operations of the second embodiment of FIG. 2.

The operations of the circuit shown in FIG. 5 in this configuration are described with reference to FIG. 6 as follows.

The AND circuit 23 generates a control signal CK synchronized with the clock signal CLK when the control signal EN1 is at a high level. This control signal CK causes the flip-flop circuit 21 to hold the data DT1.

The flip-flop circuit 24 holds for one cycle the control signal EN1 according to the clock signal CLK. The low-leakage combination circuit 22 is activated by the control signal MTE output from the flip-flop circuit 24 to then receive the data DT1 fed from the output terminal D of the flip-flop circuit 21 and the data DT2 fed from another circuit not shown, thus outputting an output signal.

The low-leakage combination circuit 22 is activated only for one cycle of the clock signal CLK in response to the control signal MTE fed from the flip-flop circuit 24. When the control signal MTE is low in level, no power is fed to the low-leakage combination circuit 22. Accordingly, the low-leakage combination circuit 22 needs to hold established data. Then, when the control signal EN2 becomes high in level to operate the flip-flop circuit 25 through the AND circuit 26, the data held at the low-leakage combination circuit 22 is fed to the flip-flop circuit 25 and held there.

Figure 7:
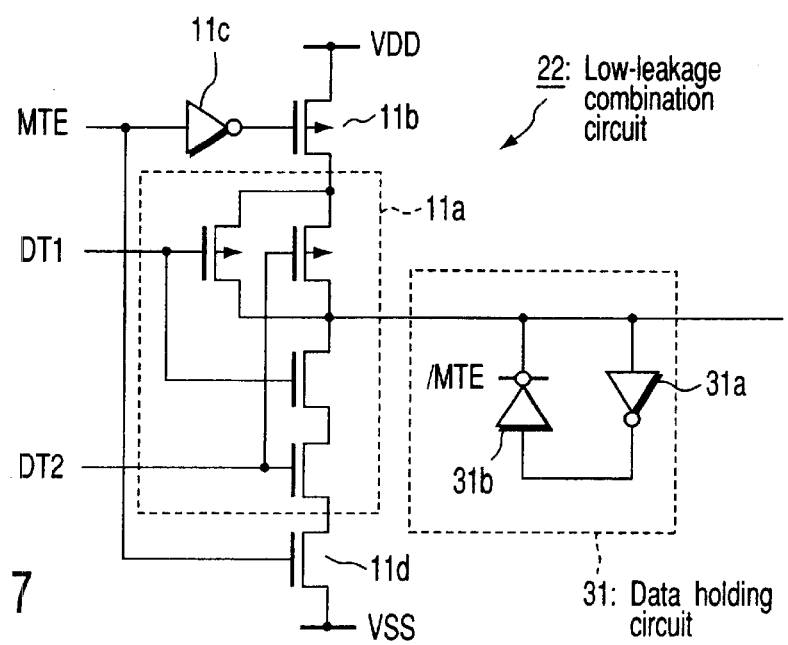
FIG. 7 is a circuit diagram showing one example of a low-leakage combination circuit of FIG. 5.

FIG. 7 shows one example of the low-leakage combination circuit 22 shown in FIG. 5. In FIG. 7, the same elements as those of FIGS. 3 and 4 are indicated by the same reference numerals, so that only those elements not common to them are described below.

In this low-leakage combination circuit 22, for example, at the output terminal of the NAND circuit 11a is connected a data holding circuit 31. This data holding circuit 31 is made up of an inverter circuit 31a and a clocked inverter circuit 31b. The inverter circuit 31a has its input terminal connected to the output terminal of the NAND circuit 11a. The inverter circuit 31a has its output terminal connected through the clocked inverter circuit 31b to the output terminal of the NAND circuit 11a. This clocked inverter circuit 31b is controlled by a control signal/MTE.

When the transistors 11b and 11d are turned ON by the control signal MTE to activate the low-leakage combination circuit 22, the clocked inverter circuit 31b does not hold output data of the NAND circuit 11a. If the transistors 11b and 11d are turned OFF, on the other hand, the data holding circuit 31 holds the immediately previous output data of the NAND circuit 11a.

Figure 8:
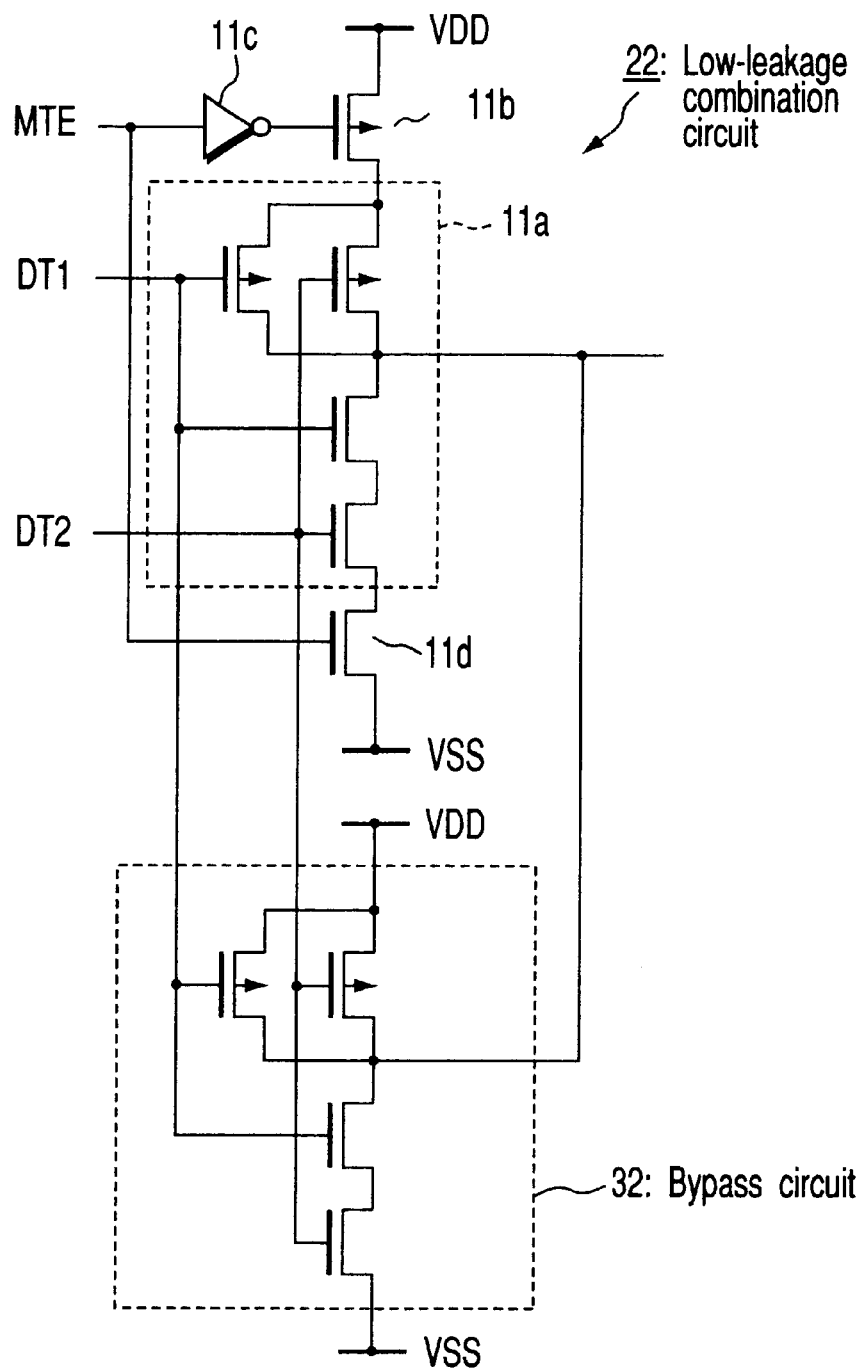
FIG. 8 is a circuit diagram showing another example of the low-leakage combination circuit of FIG. 5.

FIG. 8 shows another example of the low-leakage combination circuit 22. In FIG. 8, the same elements as those of FIGS. 4 and 7 are indicated by the same reference numerals, so that only the different elements are described below.

This low-leakage combination circuit 22 has a bypass circuit 32 in place of the data holding circuit 31 shown in FIG. 7. This bypass circuit 32 is supposed to have the same configuration as the NAND circuit 11a and is connected in parallel therewith. This bypass circuit 32 is connected directly between the power supply line VDD and the ground line VSS. In contrast to the NAND circuit 11a constituted of the low-threshold voltage transistors, this bypass circuit 32 is made up of a high-threshold voltage transistors.

In contrast to the NAND circuit 11a which is activated when the transistors 11b and 11d are ON, the bypass circuit 32 is always active. This causes the NAND circuit 11a and the bypass circuit 32 to output the same logic level of output when the transistors 11b and 11d are both ON.

If the transistors 11b and 11d are both OFF, on the other hand, the NAND circuit 11a does not operate but the bypass circuit 32 continues to operate because it is always supplied with power when the semiconductor chip or the gate circuit is active. Therefore, the bypass circuit 32 permits the immediate previous output to be output consecutively.

According to this second embodiment, only for one cycle in which the data of the flip-flop circuit 21 connected in front of the low-leakage combination circuit 22 is updated, the control signal MTE is held at a high level, thus activating the low-leakage combination circuit 22. Accordingly, the low-leakage combination circuit 22 is supplied with a current to be active only for one cycle of the clock signal CLK. Accordingly, the current dissipation can be reduced even when the semiconductor chip or the gate circuit is in an activated state because the low-leakage combination circuit 22 has a short active-state period.

The low-leakage combination circuit 22 has a function to hold data. This permits the flip-flop circuit 25 provided behind the low-leakage combination circuit 22 to receive data of the low-leakage combination circuit 22 according to the control signal EN2 fed at arbitrary timing.

Third Embodiment

Figure 9:
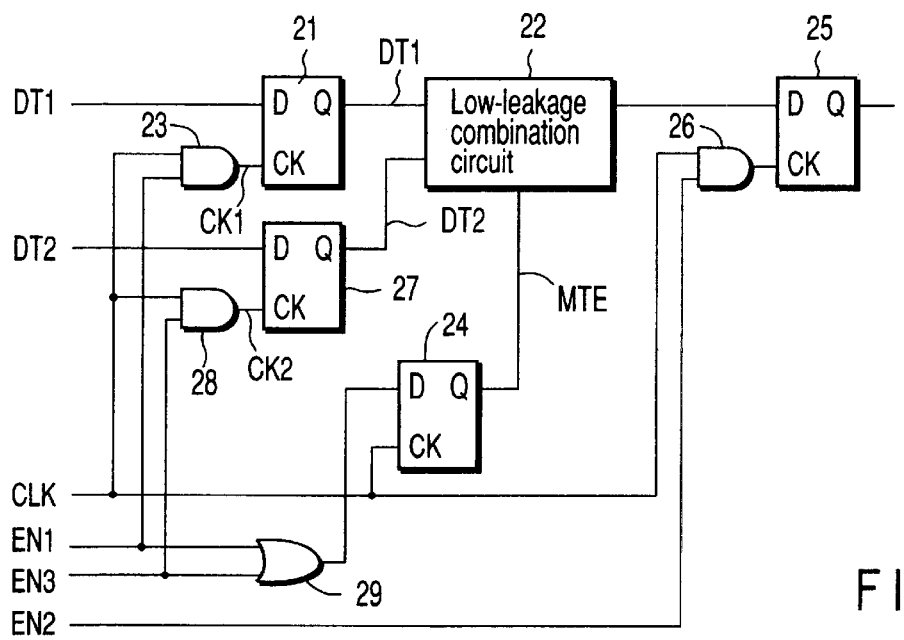
FIG. 9 is a block diagram snowing a third embodiment of the present invention.

FIG. 9 shows a third embodiment of the present invention. A circuit shown in FIG. 9 is a variant of the circuit shown in FIG. 5. Therefore, the same elements as those of FIG. 5 are indicated by the same reference numerals, so that only the different elements are described below.

In FIG. 9, the data DT2 is fed to the input terminal D of a flip-flop circuit 27. A control signal EN3 is fed together with the clock signal CLK to an AND circuit 28. An output signal CK2 of this AND circuit 28 is fed to a clock signal input terminal CK of the flip-flop circuit 27. The data DT2 fed from an output terminal Q of this flip-flop circuit 27 is fed to the low-leakage combination circuit 22.

Furthermore, the control signals EN1 and EN3 are fed through an OR circuit 29 to the input terminal D of the flip-flop circuit 24.

The operations in this configuration are described as follows. In the circuit shown in FIG. 9, the flip-flop circuits 21 and 27 hold the data DT1 and DT2 in response to the control signals EN1 and EN3, respectively. When either one of the control signals EN1 and EN3 becomes high in level, in response to the output signal of the OR circuit 29 the flip-flop circuit 24 generates the control signal MTE corresponding to one cycle of the clock signal CLK. Accordingly, the low-leakage combination circuit 22 is activated for one cycle of the clock signal CLK in response to the control signal MTE, to receive the data DT1 and DT2 output from the flip-flop circuits 21 and 27, respectively. This low-leakage combination circuit 22 holds the immediately previous data and stops upon expiration of the active period.

This third embodiment also provides almost the same effects as the second embodiment.

In the case of the third embodiment, even if it has such a circuit behind the low-leakage combination circuit 22 that is controlled by a plurality of systems of clock signals, it can be implemented by the same control method as that of FIG. 9.

Fourth Embodiment

Figure 10:
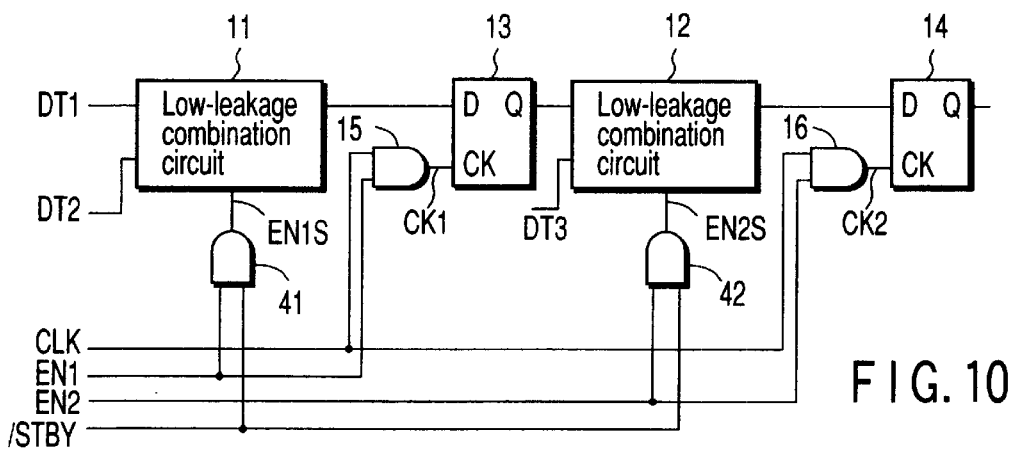
FIG. 10 is a block diagram showing a fourth embodiment of the present invention.

FIG. 10 shows a fourth embodiment. A circuit shown in FIG. 10 is a variant of that shown in FIG. 1 and the same element as those of FIG. 1 are indicated by the same reference numerals, so that only the different elements are described.

The first through third embodiments have been described as to how to reduce the leakage current when the semiconductor chip or the gate circuit is operating. The fourth embodiment enables reducing the leakage current flowing through the semiconductor chip or the gate circuit not only in its operative state but also in its standby state.

In FIG. 10, an AND circuit 41 is supplied with the control signal EN1 and a standby signal/STBY indicating a standby state. A control signal ENLS output from an output terminal of this AND circuit 41 is fed to the low-leakage combination circuit 11. Another AND circuit 42 is supplied with the control signal EN2 and the standby signal/STBY. A control signal EN2S output from an output terminal of this AND circuit 42 is fed to the low-leakage combination circuit 12. This standby signal/STBY serves to put, for example, the semiconductor chip or the gate circuit in a standby state.

Operations of this configuration are described as follows. When the standby signal /STBY becomes high in level, the circuitry is permitted to operate. Accordingly, the circuit shown in FIG. 10 operates much the same way as that shown in FIG. 1 in response to the control signals EN1 and EN2.

When the standby signal/STBY becomes low in level to provide the standby state, on the other hand, the control signals ENLS and EN2S output from the AND circuits 41 and 42 respectively become low in level. This forcedly puts the low-leakage combination circuits 11 and 12 in an inoperative state, thus providing a low-leakage mode.

In this fourth embodiment, the standby signal/STBY is used to put the low-leakage combination circuits 11 and 12 in the inoperative state. This enables reducing the leakage current not only in the operative state but also in the standby state.

Figure 11:
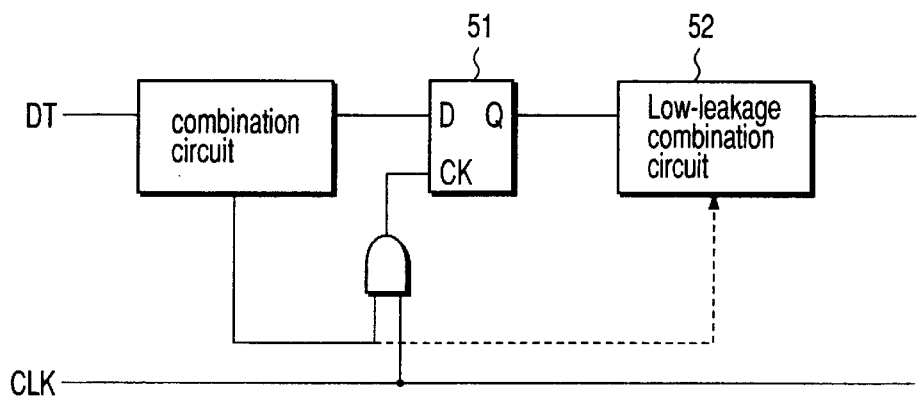
FIG. 11 is a block diagram showing a gated-clock signal circuit.

The first through fourth embodiments have been described with reference to a case where the present invention is applied to a circuit of a typical gated clock system shown in FIG. 11. That is, as shown in FIG. 11, the control signal which controls the clock signal applied to a flip-flop circuit 51 is used to control a low-leakage combination circuit 52 also. But the possible control scheme is not limited to this. For example, the present invention may be applied to a data transfer circuit of a feedback system shown in FIG. 12. In this case, a combination circuit 61 is constituted of, for example, a plurality of transistors having an ordinary threshold voltage. This combination circuit 61 is always supplied with power, to be activated. This combination circuit 61 has its output terminal connected with a first input terminal of a multiplexer (MUX) 63. This multiplexer 63 selects either one of the first and second inputs according to a control signal output from the combination circuit 61. This multiplexer 63 has its output terminal connected with an input terminal D of the flip-flop circuit 62. This flip-flop circuit 62 holds a signal output from the multiplexer 63 according to the clock signal CLK. This flip-flop circuit 62 has its output terminal Q connected to the second input terminal of the multiplexer 63 as well as to an input terminal of a low-leakage combination circuit 64. For example, the circuit shown in FIGS. 3 and 4 or that shown in FIGS. 7 and 8 can be applied to the low-leakage combination circuit 64. The low-leakage combination circuit 64 is supplied with the control signal output from the combination circuit 61. This low-leakage combination circuit 64 is activated or deactivated as interlocked with the operations of the multiplexer 63, according to the control signal.

Figure 12:
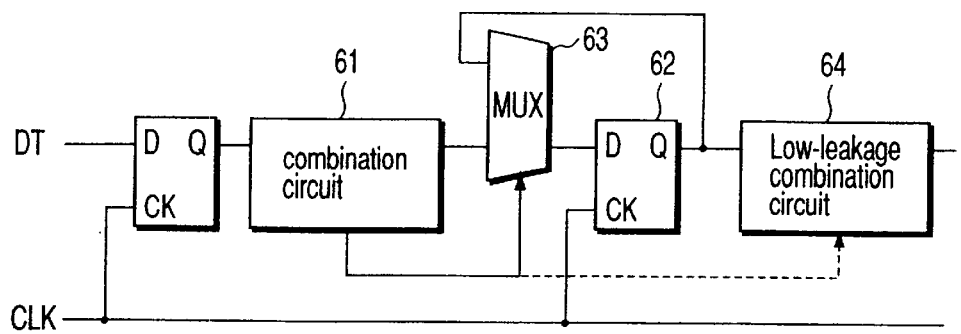
FIG. 12 is a block diagram showing a data transfer circuit of a feed-back type.
Figure 13:
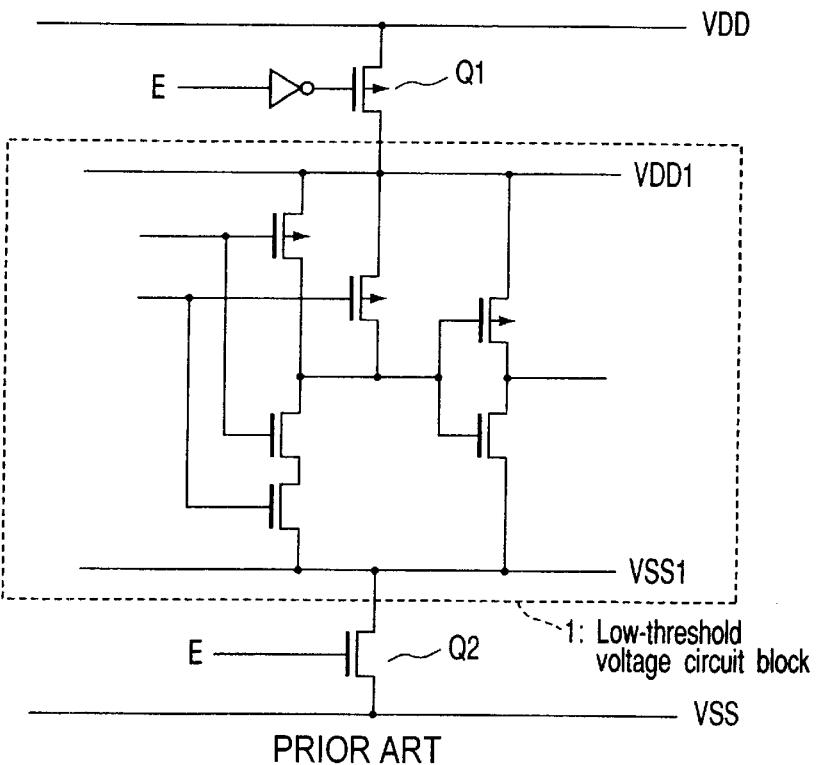
FIG. 13 is a circuit diagram showing one example of an MT-CMOS circuit.
Figure 14:
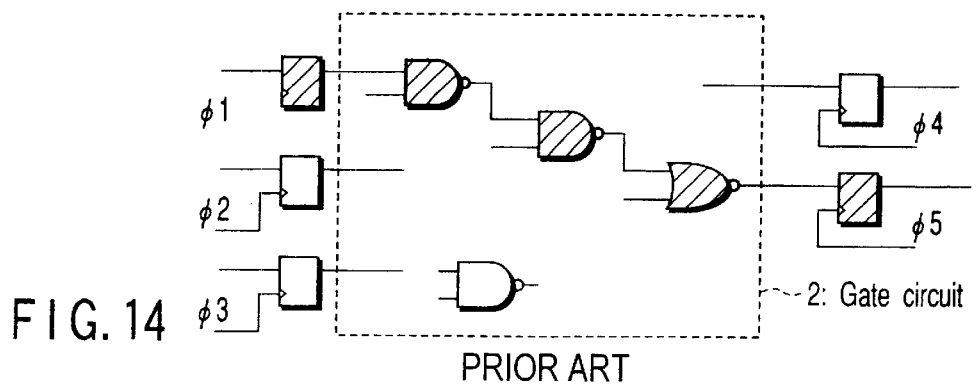
FIG. 14 is a circuit diagram showing a configuration in which part of a logic circuit of a gate circuit is made up of low-threshold voltage transistors.

The circuit of FIG. 12 also provides almost the same effects as those of the first and second embodiments.

Furthermore, the present invention can be implemented in combinations of the first embodiment and the second or third embodiment. Moreover, it can be implemented in combinations of the fourth embodiment and the first through third embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit, comprising:
    a combination circuit supplied with an input signal and a control signal, said combination circuit being switched between an active state where power is supplied thereto according to said control signal and an inactive state where said power is turned off; and a flip-flop circuit which has an input connected to an output terminal of said combination circuit, said flip-flop circuit storing an output signal of said combination circuit according to a clock signal, wherein said combination circuit is set to the active state by said control signal only when said flip-flop circuit stores the output signal of said combination circuit.

2. The circuit according to claim 1, further comprising a first logic circuit which is supplied, at input terminals thereof, with said control signal and a clock signal and which has an output terminal connected to a clock signal input terminal of said flip-flop circuit, said control signal having a width equal to a period of said clock signal and rising prior to said clock signal rises, said first logic circuit outputting said clock signal for a period when said control signal is active.

3. The circuit according to claim 2, wherein said combination circuit comprises:

a second logic circuit made up of a plurality of first transistors having a first conductivity type and a plurality of second transistors having a second conductivity type;

a third transistor of said first conductivity type which has a current path connected between said second logic circuit and a first power supply line and which has a gate supplied with said control signal; and a fourth transistor of said second conductivity type which has a current path connected between said second logic circuit and a second power supply line and which has a gate supplied with a complementary signal of said control signal, wherein said first and second transistors have a threshold voltage set lower than a threshold voltage of said third and fourth transistors.

4. A semiconductor integrated circuit comprising:

a combination circuit supplied with an input signal and a control signal, said combination circuit being switched between an active state where power is supplied thereto according to said control signal and an inactive state where said power is interrupted;

a flip-flop circuit which has an input connected to an output terminal of said combination circuit, said flip-flop circuit storing an output signal of said combination circuit according to a clock signal; and a first logic circuit which is supplied, at input terminals thereof, with said control signal and a clock signal and which has an output terminal connected to a clock signal input terminal of said flip-flop circuit, said control signal having a width equal to a period of said clock signal and rising immediately before said clock signal rises, said first logic circuit outputting said clock signal for a period when said control signal is active, wherein said combination circuit is set to an operative state by said control signal only when said flip-flop circuit stores the output signal of said combination circuit.

5. The circuit according to claim 4, wherein said combination circuit comprises:

a second logic circuit made up of a plurality of first transistors having a first conductivity type and a plurality of second transistors having a second conductivity type;

a third transistor of said first conductivity type which has a current path connected between said second logic circuit and a first power supply line and which has a gate supplied with said control signal; and a fourth transistor of said second conductivity type which has a current path connected between said second logic circuit and a second power supply line and which has a gate supplied with a complementary signal of said control signal, wherein said first and second transistors have a threshold voltage set lower than a threshold voltage of said third and fourth transistors.

6. A semiconductor integrated circuit comprising:

a combination circuit supplied with an input signal and a control signal, said combination circuit being switched between an active state where power is supplied thereto according to said control signal and an inactive state where said power is interrupted;

a flip-flop circuit which has an input connected to an output terminal of said combination circuit, said flip-flop circuit storing an output signal of said combination circuit according to a clock signal;

a logic circuit made up of a plurality of first transistors having a first conductivity type and a plurality of second transistors having a second conductivity type;

a third transistor of said first conductivity type which has a current path connected between said second logic circuit and a first power supply line and which has a gate supplied with said control signal; and a fourth transistor of said second conductivity type which has a current path connected between said second logic circuit and a second power supply line and which has a gate supplied with a complementary signal of said control signal, wherein said combination circuit is set to the operative state by said control signal only when said flip-flop circuit stores the output signal of said combination circuit, and wherein said first and second transistors have a threshold voltage set lower than a threshold voltage of said third and fourth transistors.

7. A semiconductor integrated circuit, comprising:

a combination circuit supplied with an input signal and a first control signal, said combination circuit being set to an active state where power is supplied thereto according to a first logic level of said first control signal and to an inactive state where said power is turned off according to a second logic level of said first control signal; and a flip-flop circuit which has an input connected to an output terminal of said combination circuit, said flip-flop circuit storing an output signal of said combination circuit according to a second control signal, wherein said combination circuit is set to the active state by said first control signal only when said flip-flop circuit stores the output signal of said combination circuit.

8. The circuit according to claim 7, wherein said first control signal rises prior to a rising of said second control signal and lowers after a lowering of said second control signal.

9. The circuit according to claim 4, further comprising an interruption circuit which has input terminals supplied with said control signal and a standby signal for setting a standby state and which has an output terminal connected to said combination circuit, said interruption circuit interrupting said control signal in response to said standby signal.

* * * * *